United States Patent [19]

Maruyama

[11] Patent Number: 5,757,199
[45] Date of Patent: May 26, 1998

[54] TEST CARRIER FOR SEMICONDUCTOR INTEGRATED CIRCUIT AND METHOD OF TESTING SEMICONDUCTOR INTEGRATED CIRCUIT

[75] Inventor: Shigeyuki Maruyama, Kawasaki, Japan

[73] Assignee: Fujitsu Limited, Kanagawa, Japan

[21] Appl. No.: 398,652

[22] Filed: Mar. 3, 1995

[30] Foreign Application Priority Data

Mar. 18, 1994 [JP] Japan ............... 6-048850

[51] Int. Cl.⁶ ............................. G01R 31/28
[52] U.S. Cl. ............................. 324/754
[58] Field of Search ............... 324/754, 73, 72.5

[56] References Cited

U.S. PATENT DOCUMENTS

| | | | |
|---|---|---|---|
| 4,038,599 | 7/1977 | Bove et al. | 324/754 |
| 5,378,982 | 1/1995 | Feigenbaum et al. | 324/770 |
| 5,412,866 | 5/1995 | Woith et al. | 29/848 |
| 5,477,082 | 12/1995 | Buckley, III et al. | 257/679 |
| 5,491,427 | 2/1996 | Ueno et al. | 324/754 |

*Primary Examiner*—Kenneth A. Wieder
*Assistant Examiner*—Barry C. Bowser
*Attorney, Agent, or Firm*—Nikaido, Marmelstein, Murray & Oram LLP

[57] ABSTRACT

The test carrier for the semiconductor integrated circuit device according to the present invention comprises a substrate and a substrate covering sheet. The substrate includes thereon a semiconductor chip, in which a semiconductor integrated circuit is formed, such that electrodes of the semiconductor chip are positioned upwardly. The covering sheet has contact pads to be contacted to the electrodes of the semiconductor chip and formed on one surface thereof, and has connecting wirings to be connected to the contact pads and formed on the other surface thereof.

21 Claims, 14 Drawing Sheets

TEST CARRIER FOR SEMICONDUCTOR INTEGRATED CIRCUIT AND METHOD OF TESTING SEMICONDUCTOR INTEGRATED CIRCUIT

BACKGROUND OF THE INVENTION

1. Field of the Invention

The present invention relates to a test carrier for a semiconductor integrated circuit and a method of testing the semiconductor integrated circuit. More particularly, the present invention relates to a test carrier for holding a semiconductor integrated circuit subject to an accelerated test etc. and a method of testing the semiconductor integrated circuit by using the test carrier.

2. Description of the Prior Art

Recently, a high integration of the semiconductor integrated circuit (LSI) has been required and demand for downsizing of electronic devices has increased. In order to satisfy these requirements, not only the high integration of elements in the LSI is required but also a high density packaging technology of the semiconductor chip is required. Such high density packaging technology becomes dominant in the fields of bare chip packaging, a MCM (multi-chip module) and the like.

In the above circumstances, various attempts have been made to test the LSI as a bare chip.

Before the LSI is supplied to the user as a product in a bare chip state, both a thermally accelerated test (referred to as a Burn In (B.I) test hereinafter) and a Final Test (FT) are conducted in the bare chip state to detect initial defects of the LSI. In the B.I test, while heating the semiconductor integrated circuit, the various electric properties thereof are examined.

If a product like the MCM, in which a plurality of semiconductor chips are formed into one package, includes only one defect chip in the package, the entire product is defective. Therefore, the bare chip test is inevitably required for each individual bare chip. Thus, in the product in which a plurality of semiconductor chips are mounted in one package, each semiconductor chip must be subject to the B.I test in the bare chip state. Such test may be required with a greater degree of frequency in future. However, regarding the B.I test conducted in the bare chip state, the testing technology at present has yet to be established.

In general, when the semiconductor integrated circuit formed on the semiconductor wafer is tested, a so-called PP (Production Probe) test has been frequently utilized wherein test probes electrically connected to the testing apparatus are contacted to minute electrodes formed on the surface of the semiconductor wafer.

A first test method may be considered to comprise the application of the PP test together with the use of the B.I test used for the bare chips of the semiconductor integrated circuit. According to the first test method, as shown in FIG. 1, probes 1 connected to the electric characteristic detecting apparatus (not shown) are contacted to minute electrodes 2A formed on the surface of the semiconductor chip 2. In this situation, the probes 1 and the semiconductor chip 2 are then placed in the heating furnace. The B.I test is then carried out while the semiconductor integrated circuit on the semiconductor chip 2 is operated in the high temperature surrounding.

In addition, a second test method may be considered to comprise the application of the B.I test while directly contacting terminals of the IC socket to the electrodes of the bare chip. The terminals of the IC socket are used to test the semiconductor integrated circuit chip packaged by resin etc. Such IC socket is exemplified in FIG. 7.

Furthermore, as shown in FIG. 2A, a third test method may be considered to comprise the application of the B.I test of the semiconductor chip 2 under such conditions that electrodes 2A of the semiconductor chip 2 contact test electrodes 3B formed on the lower surface of the insulating polyimide test sheet 3 and that connecting wiring patterns 3A, which are formed on the upper surface of the test sheet 3 and connected to the test electrodes 3B, connect to the electric characteristic detecting apparatus.

However, in the above first, second and third test methods, the following problems occur.

In the first test method, as shown in FIG. 1, in order to contact the probes 1 to the minute electrodes 2A on the semiconductor chip 2, location displacements between many of probes 1 aligned in high density and the electrodes 2A of the semiconductor chip 2 must be first corrected by an image recognition technique before the probes 1 and the electrodes 2A are connected to each other. The probe 1 is in general very expensive. Moreover, it is not practical to provide an individual semiconductor chip with an alignment device. If this was done, cost would be enormously raised and thereof makes the semiconductor chip very expensive.

According to the second test method, in contrast to the electrodes of the semiconductor chip, top portions of the contact pins of the IC socket vary largely in size and location so that an increased alignment error results in between the IC socket and the semiconductor chip. Further, it is difficult to increase the integration density of the contact pins of the IC socket correspondingly to a miniaturization of the electrodes of the semiconductor chip.

Moreover, according to the third test method, after the electrodes 3B on the test sheet 3 and the contact electrodes 2A of the semiconductor chip 2 are aligned, a location discrepancy between the electrodes 2A and the electrodes 3A is caused due to the vibration generated during the B.I test and the shock generated while carrying the test sheet 3, so that the third test cannot be effected satisfactorily. In addition, since the electrodes 3B of the test sheet 3 is formed minutely and the test sheet 3 is formed by the flexible film such as the polyimide film, stable contacts cannot be obtained between the contact electrodes 2A and the electrodes 3B of the contact sheet 3 unless the entire test sheet 3 is pressed uniformly against the semiconductor chip 2. It can be considered to bond both the electrodes 2A, 3A by solder. But, according to this method, it is hard to remove the semiconductor chip 2 from the test sheet 3 after the test is completed. Therefore, the semiconductor chip 2 so tested cannot be forwarded promptly as the product.

In addition, as the common drawback to the above first to third test methods, when, like the ordinarily packaged IC, the bare chip is tested by the B.I test in the air, defects such as a burning are caused because dusts are attached to the bare chip, and so on. When the chips are heated for a long time in the air, the electrodes of the semiconductor chip are oxidized and thus degraded. Thus packaging and connection characteristics of the semiconductor chip are lowered.

As described above, it is in fact extremely hard to conduct the B.I test in the bare chip state by means of the existing technologies.

SUMMARY OF THE INVENTION

It is an object of the present invention to provide a test carrier for a semiconductor integrated circuit capable of increasing the reliability of a bare chip test and a method of testing the semiconductor integrated circuit device using the test carrier.

According to the present invention, the test carrier comprises a substrate for holding a semiconductor chip thereon, and a sheet having connection electrodes thereon for electrically connecting electrodes of the semiconductor chip to an exterior by contacting pads to the electrodes when the substrate is covered by the sheet. Various tests can be conducted in the situation where the semiconductor chip is mounted on the test carrier.

Thus, even if the electrodes are formed on a surface of the semiconductor chip in high density, electric connections between test terminals of a test device and the semiconductor chip can be readily obtained. In addition, since electric connections between the semiconductor chip and the pads formed on the sheet become hard to be disconnected by vibrations, a test for the semiconductor chip can be effected with high reliability.

Moreover, since a pressure of a clearance formed between the substrate on which the semiconductor chip is mounted and the sheet can be set lower than an atmospheric pressure so that the sheet is pulled to the substrate side, the pads on the sheet is strongly pushed toward the electrodes of the semiconductor chip. As a result, the pads is caused to contact firmly to the electrodes, and therefore the reliability of the test for the semiconductor chip can be further increased.

Furthermore, since the space formed between the substrate on which the semiconductor chip is mounted and the sheet can be reduced in pressure or since the space is filled with an inert gas, the electrodes formed on the surface of the semiconductor chip become hard to be oxidized when an electric characteristics of the semiconductor chip is tested in heating circumstance.

If a concave portion into which the semiconductor chip is disposed is formed on the substrate and a groove is formed around a periphery of the concave portion, a volume of the clearance formed between the substrate and the sheet can be increased. Therefore, if the pressure between the substrate and the sheet is made lower than the atmospheric pressure, a force for drawing the sheet to the substrate side can be increased. As a result, the substrate can be contacted to the sheet more firmly.

In addition, a sealing material, for instance, an O ring, can be fitted into the groove formed to surround the concave portion on the substrate, so that a sealing property for the space formed around the semiconductor chip on the substrate can be improved.

If the substrate is secured to the sheet via an adhesive, the situation is avoided where the substrate is disconnected from the sheet. In order make it easy to strip off the sheet from the substrate, if a notched groove is formed around an edge of the substrate, the sheet can be readily striped off from the substrate by inserting a tweezers or a finger into the notched groove. Such test carrier can be widely utilized by forming a shape of the molded semiconductor device so as to fit to the testing socket.

As described above, since it is not required to align testing terminals of the test device with minute electrodes of the semiconductor integrated circuit, the electric test and the B.I test of the semiconductor integrated circuit can be conducted in the bare chip state with a high degree of reliability, which could not be done by the conventional test method.

DETAILED DESCRIPTION OF THE PREFERRED EMBODIMENTS

Preferred embodiments of the present invention will now be described hereinafter with reference to the accompanying drawings.

(First Embodiment)

The first embodiment of the present invention will be described with reference to FIGS. 3A, 3B, 4, 5A, 5B, 6A, 6B, 7, 8 and 9 hereinbelow.

Figure 1:
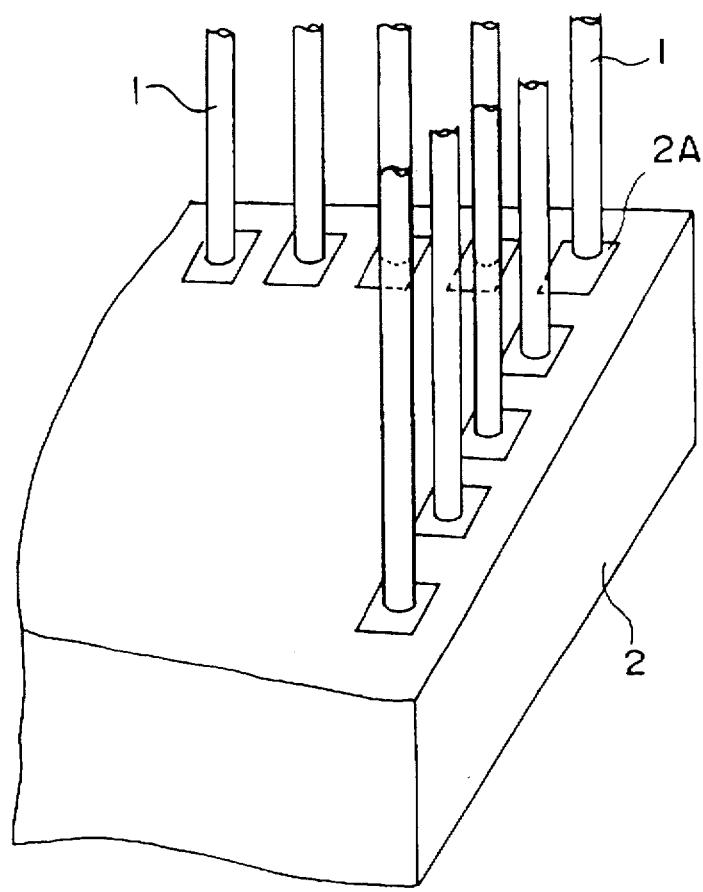
FIG. 1 is a perspective view showing the situation where the circuit test for the semiconductor chip is effected using the conventional test apparatus.
Figure 2A:
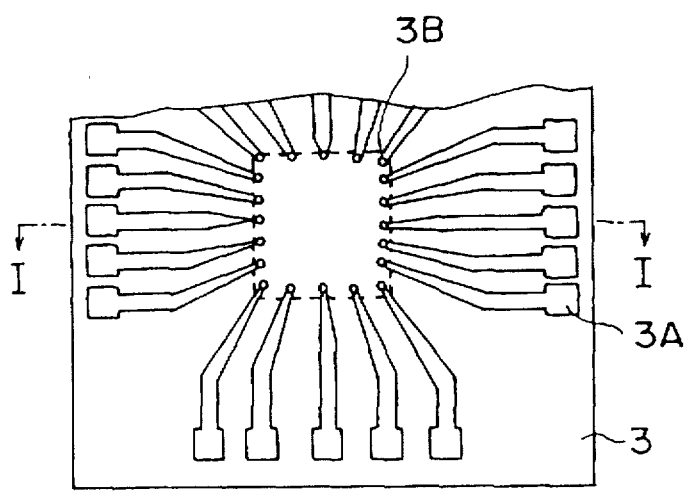
FIG. 2A is a plane view showing the situation where the circuit test for the semiconductor chip is effected using the conventional film.
Figure 2B:
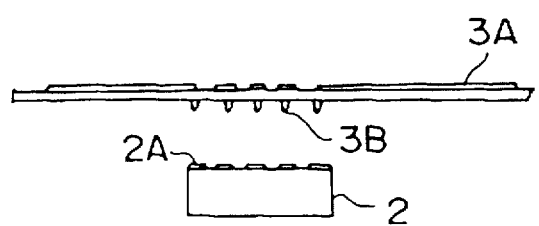
FIG. 2B is a cross-sectional view showing a fitting state of the semiconductor chip to the film, taken along the I—I line in FIG. 2A.
Figure 3A:
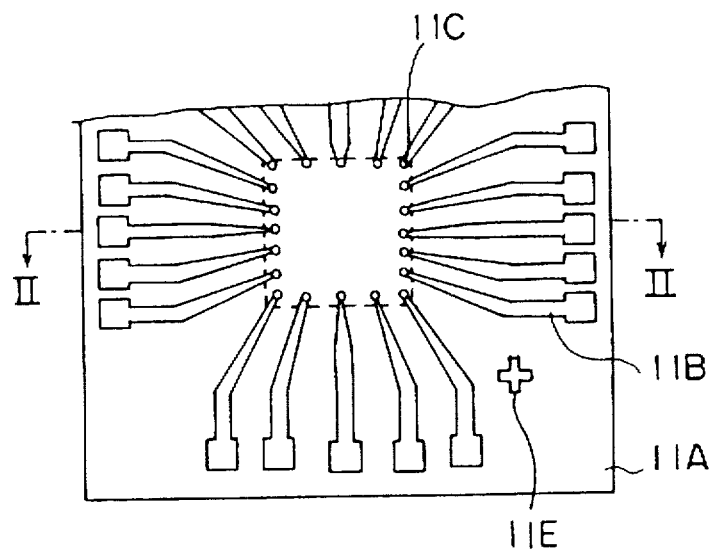
FIG. 3A is a plane view showing the test carrier for the semiconductor integrated circuit device according to the first embodiment of the present invention.
Figure 3B:
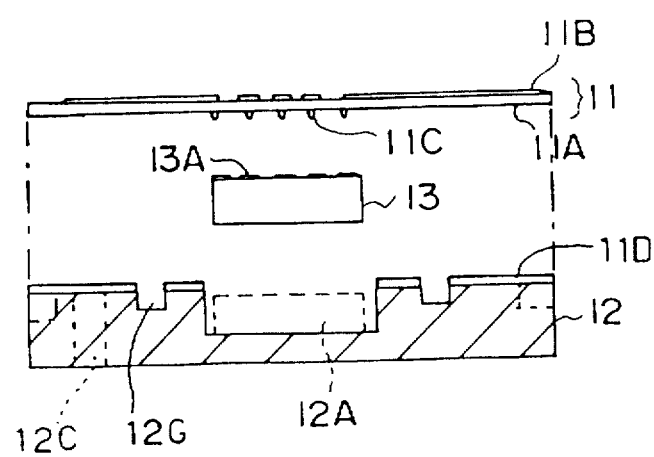
FIG. 3B is a cross-sectional view showing the displacement relation between the test carrier for the semiconductor integrated circuit device according to the first embodiment of the present invention and the semiconductor chip, taken along the II—II line in FIG. 3A.

As shown in FIGS. 3A and 3B, a test carrier for a semiconductor integrated circuit device according to the first embodiment includes a sheet 11 having contact electrodes and a substrate 12.

The sheet 11 for covering the substrate 12 comprises a film 11A made of a flexible material such as polyimide and having a thickness of about 0.01 to 0.05 mm, a plurality of contact pads 11C formed on one surface of the film 11A, and a plurality of conductive wiring patterns 11B formed on one or the other surface of the film 11A and connected to the contact pads 11C. The plurality of contact pads 11C are so formed that they can correspondingly contact the plurality of electrodes 13A formed on a semiconductor chip 13 which is mounted on the substrate 12. Also, the plurality of wiring patterns 11B formed on the film 11A are formed so as to have patterns to be contacted to a plurality of terminals of a socket of the testing device described later.

The substrate 12 is made of epoxy resin or the like. A concave pocket 12A, in which the semiconductor chip 13 is disposed, is formed in the central portion of the substrate 12.

In the next, a method of holding the semiconductor chip as an object to be tested in the test carrier will be explained.

Figure 4:
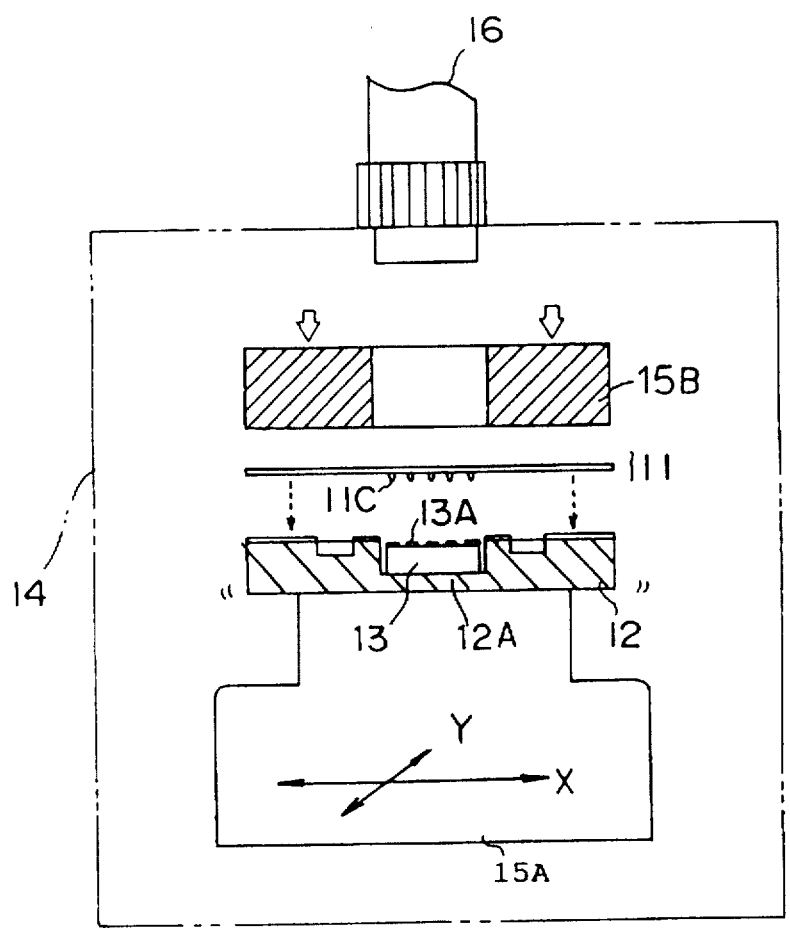
FIG. 4 is a cross-sectional view showing schematically a method of incorporating the semiconductor chip into the test carrier for the semiconductor integrated circuit device according to the first embodiment of the present invention.

First, as shown in FIG. 4, while the semiconductor chip 13 is displaced in the pocket 12A of the substrate 12, the substrate 12 is placed in a vacuum furnace 14 to be mounted on an XY stage 15A. Then the sheet 11 is also carried into the vacuum furnace 14 and is then fixed therein by a fixing device (not shown). In this case, as shown in FIG. 3B, an adhesive 11D is applied to at least either the upper surface of the substrate 12 and the lower surface of the film 11A. In this case, the semiconductor chip 13 is placed in the pocket 12A so that the electrode 13A face to the sheet 11.

Subsequently, with confirming location displacements between the electrodes 13A of the semiconductor chip 13 and the contact pads 11C of the sheet 11 by mean of a microscope 16, the location of the semiconductor chip 13 is adjusted by moving the XY stage 15A so that the contact pads 11C are displaced right over the electrodes 13A. In addition, after the sheet 11 is moved toward the substrate 12, the contact pads contact the electrodes 13A, so as to again finely adjust the location of the XY stage 15A. While reducing a pressure in the vacuum furnace 14 or after an operation for reducing the pressure is effected, this alignment is conducted.

Figure 5A:
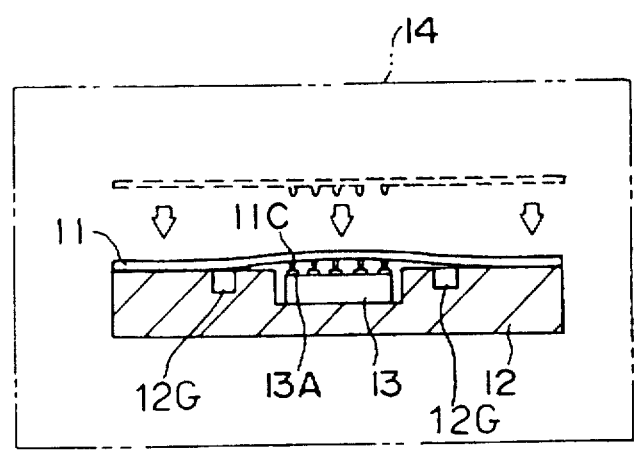
FIG. 5A is a cross-sectional view showing the situation where the semiconductor chip is incorporated into the test carrier for the semiconductor integrated circuit device according to the first embodiment of the present invention in the reduced pressure atmosphere.

As shown in FIG. 5A, when peripheral areas of the contact pads 11C of the sheet 11 are pushed strongly to the substrate 12 by a press device 15B in reduced pressure, the lower surface of the sheet 11 is secured against the upper surface of the substrate 12 by an adhesive 11D. The adhesive 11D is made of epoxy resin or the like. When an inert gas such as nitrogen or argon is introduced into the vacuum furnace 14 in reduced pressure, oxygen is not included at all in the vacuum furnace 14, otherwise an amount of oxygen is reduced in the vacuum furnace 14. Thereby, although the amount of the inert gas is very little, such inert gas is introduced into clearances formed between the substrate 12 and the sheet 11, for example, inner spaces of the pocket 12A and a ring-like groove 12G formed around the pocket 12A. The inert gas is used to reduce the amount of oxygen.

Figure 5B:
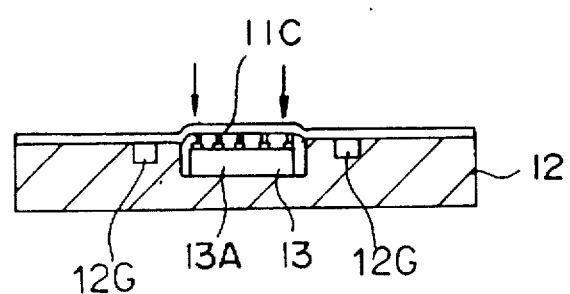
FIG. 5B is a cross-sectional view showing the situation where the test carrier according to the first embodiment into which the semiconductor chip is incorporated is exposed into the air.

Next, as shown in FIG. 5B, the test carrier on which the semiconductor chip 13 is mounted is carried out from the vacuum furnace 14 to put the chip 13 in normal pressure, the sheet 11 is pulled to the chip 13 and the substrate 12 due to pressure difference between the pressure in the space formed between the sheet 11 and the substrate 12 and the atmospheric pressure. As a result, the contact pads 11C is pressed toward the electrodes 13A by uniform force. In this case, the adhesive interposed between the sheet 11 and the substrate 12 also serves as a sealing material.

Figure 6A:
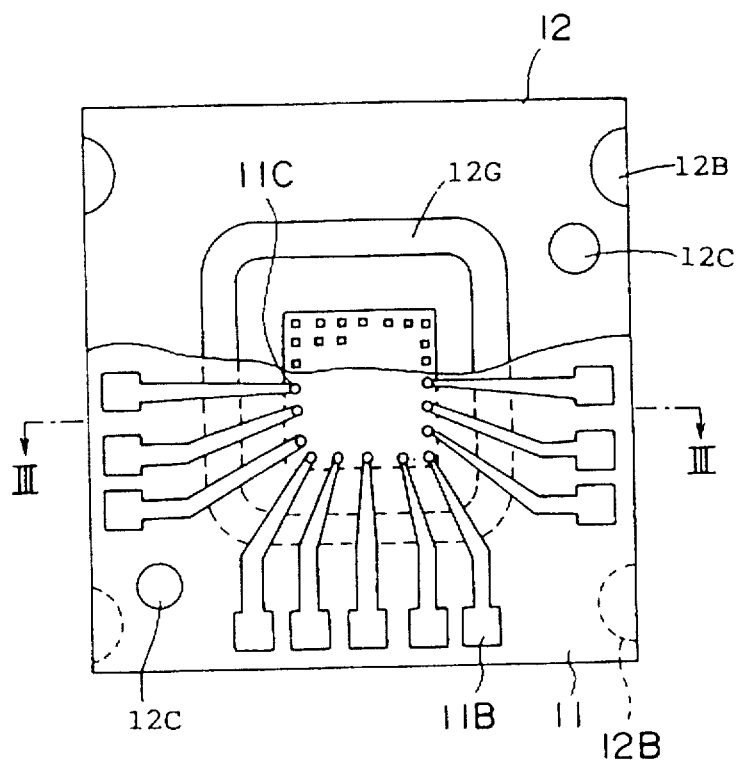
FIG. 6A is a plane view showing an example where the sheet suction groove and the notched groove are formed on the test carrier according to the first embodiment of the present invention.
Figure 6B:
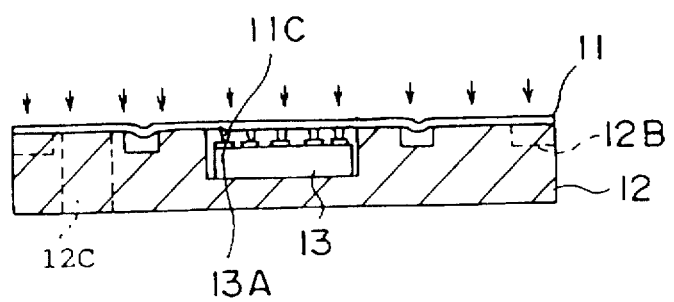
FIG. 6B is a cross-sectional view showing a sectional shape taken along the III—III line in FIG. 6A.

According to the above operations, as shown in FIGS. 6A and 6B, the contact pads 11C of the sheet 11 and the electrodes 13A of the semiconductor chip 13 are firmly and strongly connected together. Fitting operations of the semiconductor chip has been completed by the above steps.

In this test carrier, since the contact pads 11C of the sheet 11 and the electrodes 13A of the semiconductor chip 13 are firmly connected by an appropriate contact force and then fixed, their contacts are not easily disconnected because of vibrations during the B.I test, shocks during transportation or the like.

Since it is not necessary to use a probe pin that is used in the test for the semiconductor integrated circuit in the wafer state, the cost of the test can be reduced. In addition, if the electrodes 13A of the semiconductor chip 13 are formed in high density, the test can be effected to meet the actual circumstance of the semiconductor chip since the contact pads 11C can also be correspondingly formed easily in high density.

Figure 7:
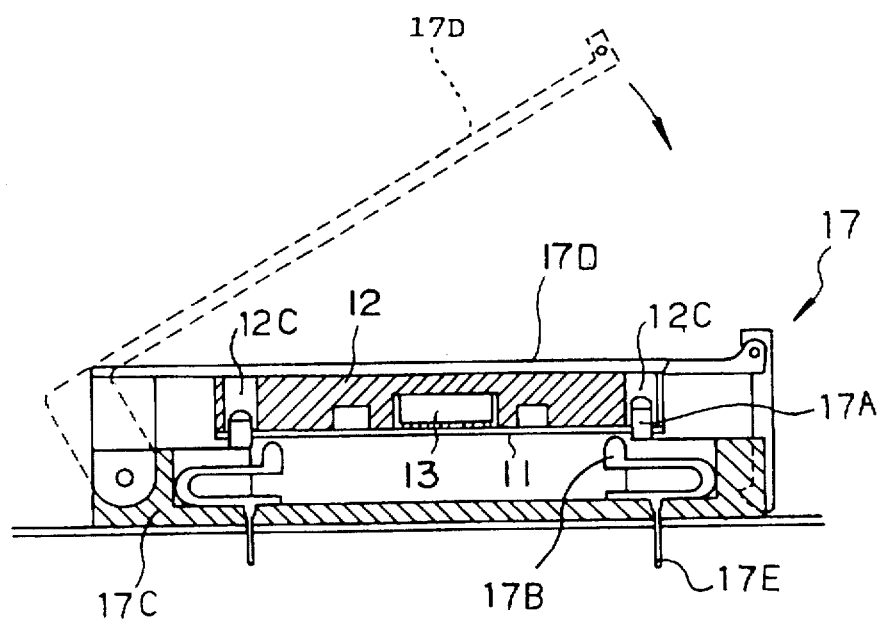
FIG. 7 is a cross-sectional view showing the situation where the test carrier according to the first embodiment of the present invention into which the semiconductor chip is incorporated is fitted into the socket for the B.I test.

Then, as shown in FIG. 7, the B.I test is performed after the test carrier described above is fitted into an IC socket 17 of the heating furnace for the B.I test, which is used for the packaged semiconductor chip.

The IC socket 17 is provided with supporting pins 17A, electrode pins 17B for contacting to connecting wiring patterns 11B of the sheet 11, a socket main body 17C, and a cover 17D. The supporting pins 17A are inserted into pin holes 12C formed in the substrate 12 of the test carrier. Each of the electrode pins 17B is formed so as to have a spring force under the condition where the test carrier is pressed by the cover 17D. The pin 17B has a terminal 17E connected to the test circuit not shown.

While keeping the heating furnace for the B.I test at temperature of about 125° C for a constant time (for example, 48 hours or 96 hours), the B.I test is conducted by applying signals to the semiconductor chip 13 via the electrode pins 17B, the wiring patterns 11B, the contact pads 11C and the electrodes 13A. Thus changes in electric characteristics of the semiconductor chip is examined during heating.

After completing the B.I test, the test carrier is removed from the IC socket 17. Then the semiconductor chip 13 is taken out by stripping off the sheet 11 from the substrate 12 of the test carrier.

The semiconductor chip 13, characteristic changes of which is confirmed and allowed by the B.I test, is forwarded as the product.

Figure 8:
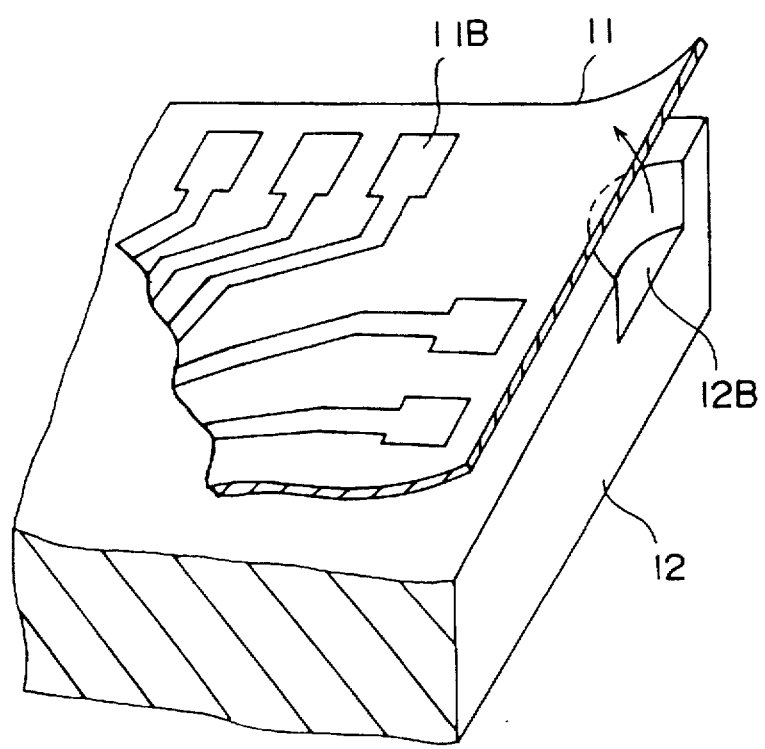
FIG. 8 is a perspective view showing the situation where the sheet is stripped off from the test carrier according to the first embodiment of the present invention.

Since, in this B.I test, the oxygen is scarcely included in the space between the sheet and the substrate 12, the electrodes 13A of the semiconductor chip 13 are never oxidized by heating. Further, if the adhesive 11D for contacting the sheet 11 to the substrate 12 is formed with a material which reduces its adhesive property when it is heated, the sheet can be easily stripped off. In addition, since, as shown in FIGS. 6A and 6B, notches 12B are formed on part of an edge of the substrate 12, the sheet 11 can be readily stripped off by inserting the tweezers or the finger nail into the notched portion 12B, as shown in FIG. 8, after completing the B.I test.

Figure 9A:
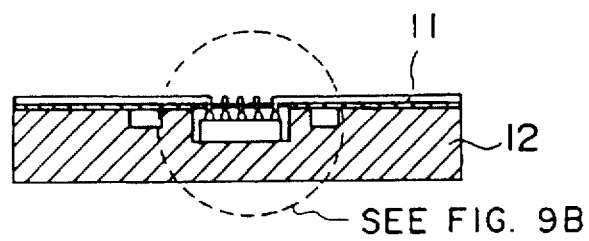
FIG. 9 is a cross-sectional view showing the situation where the semiconductor chip having hemisphere-like electrodes is incorporated into the test carrier according to the first embodiment of the present invention.
Figure 9B:
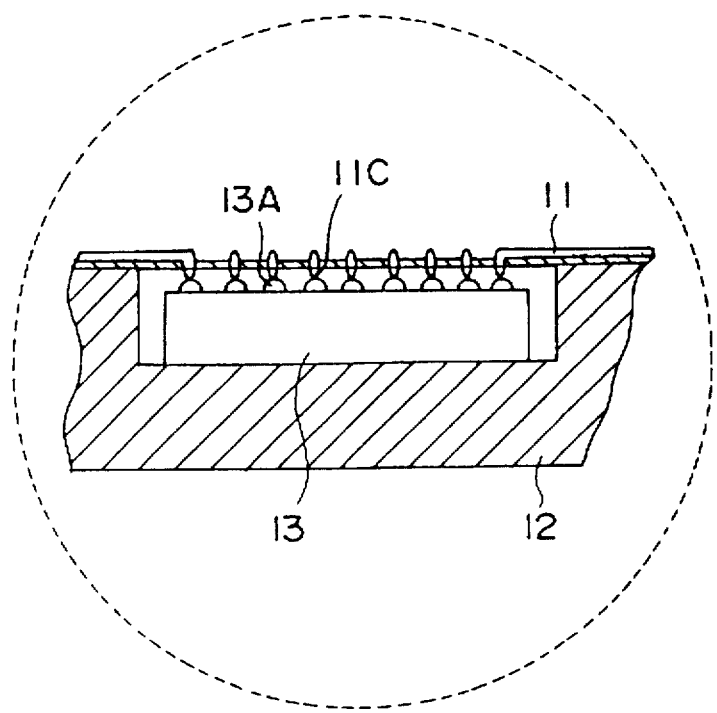

In the meanwhile, as shown in FIG. 9, according to the test carrier of this embodiment, in case an area bump chip having hemispherical electrodes 13A is tested, the hemispherical electrodes 13A and the contact pads 11C are easily aligned so as to contact them. In addition, since they are contacted to each other by pressing one to the other, they are not easily disconnected. Therefore, the test carrier can be used for a test with vibrations.

Moreover, since the rear surface of the semiconductor chip 13 and the bottom surface of the pocket 12A formed on the substrate 12 are tightly contacted, a heating temperature of the chip under test can be readily controlled by forming the substrate 12 with a high heat radiating material such as aluminum, for example.

The reliability of the test can be therefore improved.

But, at that time, it is preferable to cover the inner surface of the pocket 12 and the bottom surface of the substrate 12 with an insulating film since the aluminum is a conductive material.

Furthermore, since, upon assembling the chip, the interior of the vacuum furnace 14 is made in vacuum state or is filled with the low pressure inert gas, especially the oxygen is never mixed, the oxygen scarcely remains in the pocket 12A for mounting the chip thereon. Thus, even if the chip is heated by the B.I test at high temperature for a long while, the deterioration of the contact electrodes 13A formed on the chip 13 because of oxidization can be prevented.

As shown in FIG. 3A, in case the electrodes 13A of the semiconductor chip 13 and the contact pads 11C of the sheet 11 are aligned automatically with each other, a mechanism is required to determine whether alignment marks 11E, which are formed on both the sheet 11 and the substrate 12, coincide with each other. However, it is important that the size of the mechanism must be decided so that the semiconductor chip 13 cannot slide in the pocket 12A.

(Second Embodiment)

The first embodiment of the present invention will be described with reference to FIGS. 10A, 10B, 11A, 11B, 12A and 12B hereinbelow. In these Figures, the same references as used for the first embodiment will be used to denote the identical components, so that their redundant description of matters described in the first embodiment will be omitted.

Figure 10A:
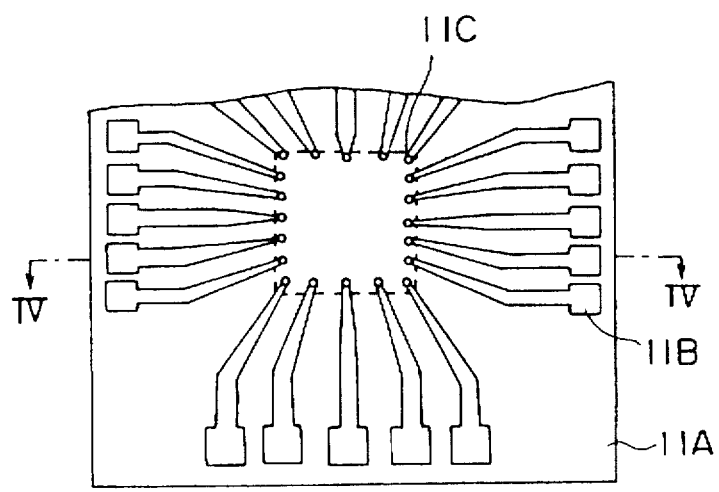
FIG. 10A is a plane view showing the test carrier for the semiconductor integrated circuit device according to the second embodiment of the present invention.
Figure 10B:
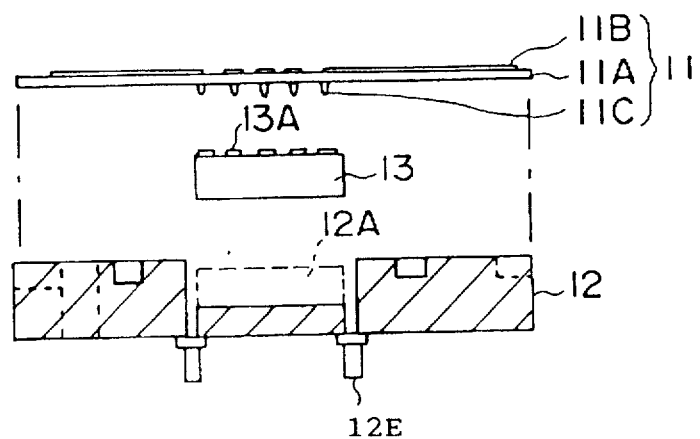
FIG. 10B is a cross-sectional view showing the displacement relation between the test carrier for the semiconductor integrated circuit device according to the second embodiment of the present invention and the semiconductor chip, taken along the IV—IV line in FIG. 10A.

At first, a test carrier for the semiconductor integrated circuit device according to the second embodiment will be explained with reference to FIGS. 10A and 10B.

Like the first embodiment, the test carrier for the semiconductor integrated circuit device according to the second embodiment comprises a sheet 11 and a case 12.

The sheet 11 for covering the substrate 12 comprises a film 11A made of polyimide having a thickness of about 0.01 to 0.05 mm, a plurality of contact pads 11C formed on one surface of the film 11A, and a plurality of conductive wiring patterns 11B formed on the other surface of the film 11A and connected to the contact pads 11C. The plurality of contact pads 11C are so formed that they can contact correspondingly to the plurality of electrodes 13A formed on a semiconductor chip 13 which is mounted on the substrate 12.

The substrate 12 is formed of epoxy resin or the like. A concave pocket 12A in which the semiconductor chip 13 is disposed is formed in the central portion of the substrate 12. A coupler 12E serving as a switching valve is provided under the pocket 12. The second embodiment is different from the first embodiment in that such coupler 12E is provided. The coupler 12E is connected to the pocket 12A. Therefore, in the situation where the semiconductor chip 13 is housed in the pocket 12, the coupler 12E serves as an exhaust valve to exhaust the air from the space formed between the substrate 12 and the sheet 11, and to thus reduce the pressure therein.

A method of displacing the semiconductor chip 13 as a tested object into such test carrier will be explained hereinbelow.

Figure 11A:
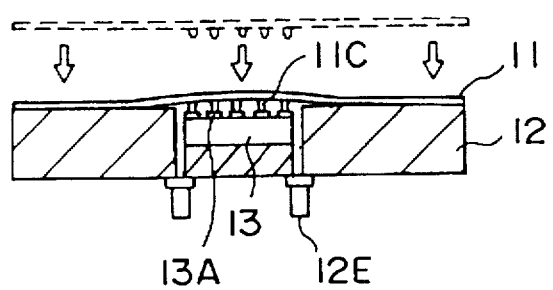
FIG. 11A is a cross-sectional view showing the situation where the semiconductor chip is incorporated into the test carrier for the semiconductor integrated circuit device according to the second embodiment of the present invention in the reduced pressure atmosphere.

First, the semiconductor chip 13 is displaced in the pocket 12A of the substrate 12. Then, as shown in FIG. 11A, the electrodes 13A of the semiconductor chip 13 and the contact pads 11C of the sheet 11 are contacted by the same operations as in the first embodiment using the vacuum furnace 14 shown in FIG. 4. Furthermore, as in the first embodiment, the sheet 11 and the substrate 12 are bonded by the adhesive. The heating furnace 14 is kept at a normal pressure during these operations. In this case, the coupler 12E is held in open state.

Figure 11B:
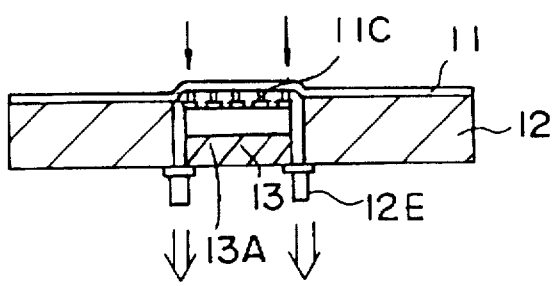
FIG. 11B is a cross-sectional view showing the situation where the test carrier according to the second embodiment into which the semiconductor chip is incorporated is exposed into the air.

Thereafter, as shown in FIG. 11B, the coupler 12E is connected to a suction apparatus (not shown) while it is opened. Subsequently, the pressure in the pocket 12A is reduced lower than the normal pressure by exhausting the air in the pocket 12A by the suction apparatus. After this, the pressure in the space formed between the sheet 11 and the substrate 12, for example, the pressure in the pocket 12, is reduced by closing the coupler 12E. After closing the coupler 12E, the suction apparatus is removed.

Figure 12A:
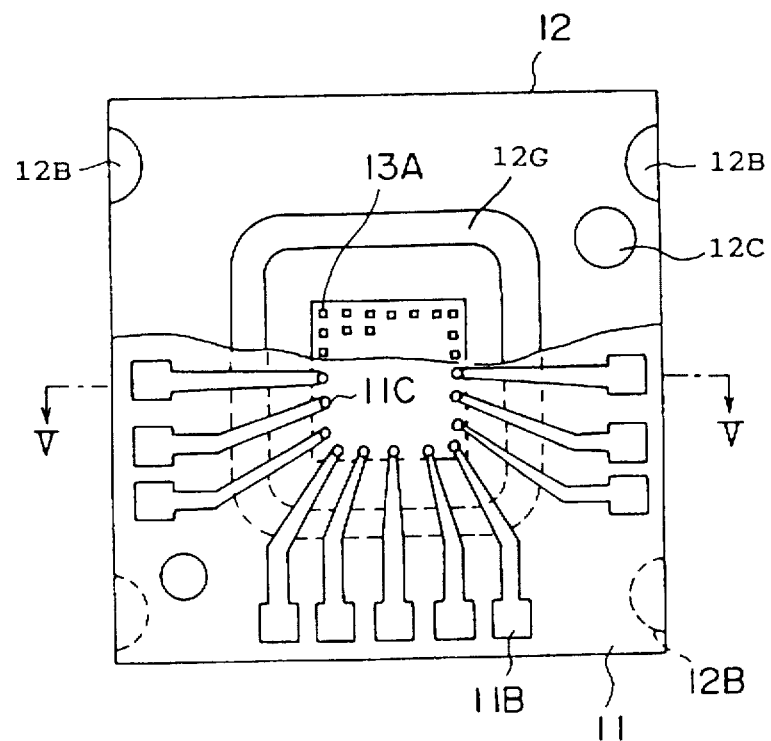
FIG. 12A is a plane view showing an example where the sheet suction groove and the notched groove are formed on the test carrier according to the second embodiment of the present invention.
Figure 12B:
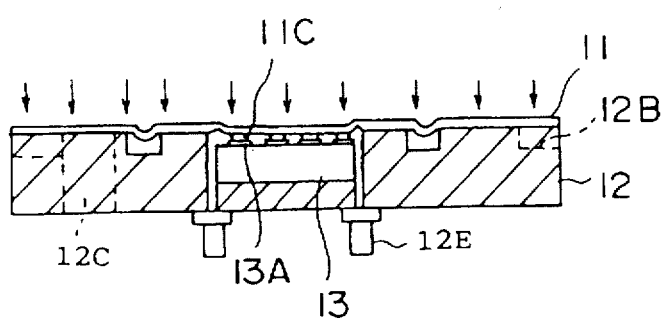
FIG. 12B is a cross-sectional view showing a sectional shape taken along the V—V line in FIG. 12A.

With the above, as shown in FIGS. 12A and 12B, after the operation of installing the semiconductor chip into the test carrier is completed, and thereafter the test carrier is fitted into the IC socket 17, as shown in FIG. 7, the B.I test is effected like the first embodiment.

According to the second embodiment, not only the same advantages as obtained in the first embodiment can be achieved, but also it is not necessary to fit the semiconductor chip in reduced pressure or in vacuum atmosphere upon assembling the chip. Thus the throughput can be improved because the time used for reducing the pressure of whole interior of the vacuum furnace is not required. In addition, exhausting an interior of the pocket 12E via the coupler 12E can be done by a simple suction apparatus such as an electric cleaner in a short period of time.

Accordingly, in fact, it can be formed simply and cheaply without requiring a large equipment in size such as the vacuum furnace.

(Third Embodiment)

The third embodiment of the present invention will be described with reference to FIG. 13 hereinbelow. In these Figures, the same references as used for the first embodiment will be used to denote the identical components, so that their redundant description of matters described in the first and second embodiments will be omitted.

Figure 13:
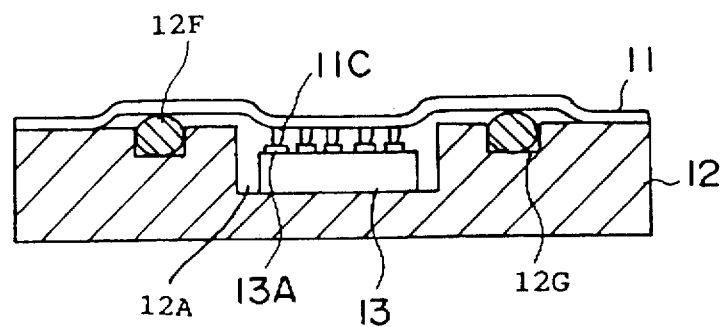
FIG. 13 is a cross-sectional view showing the test carrier for the semiconductor integrated circuit device according to the third embodiment of the present invention.

As shown in FIG. 13, like the first embodiment, the test carrier for the semiconductor integrated circuit device according to the third embodiment comprises a sheet 11 and a substrate 12. However, the third embodiment is different from the first embodiment in that an O ring 12F is embedded into a ring groove 12G surrounding a pocket 12A of the substrate 12 so that the sheet 11 and the O ring 12F are hermetically contacted. The O ring 12F is formed of an elastic material such as rubber, resin etc..

Since the O ring 12E is interposed between the sheet 11 and the substrate 12, a sealing property between them can be increased more than that of the test carrier in the first embodiment. As a result, an alignment displacement between them becomes more difficult to be occurred due to vibrations during the test or shocks during transportation.
(Fourth Embodiment)

The fourth embodiment of the present invention will be described with reference to FIGS. 14 and 15 hereinbelow.

The test carrier for the semiconductor integrated circuit according to the fourth embodiment is different significantly from the embodiments described above in that, in place of using the substrate having the pocket thereon as the substrate on which a semiconductor chip 23 as a tested object is mounted, the substrate made of thin plate-like member of polyimide, epoxy resin etc. is used. The test carrier made of the film substrate 21 and the sheet 11 has a structure shown in FIG. 14, for example. The sheet 11 has substantially the same structure as those of the first to third embodiments. The substrate 21 is formed by the same material as the film 11A forming the sheet 11, that is, by the polyimide film having a thickness of about 0.01 to 0.05 mm. Contact pads are formed on the lower surface of the substrate 21 and wiring patterns are formed on the upper surface of the substrate 21.

When mounting the semiconductor chip 23 on the test carrier, the following assembling operations are performed.

First, the semiconductor chip 23 to be tested is put on the film substrate 21 and fixed there. Then the chip 23 is placed in the vacuum furnace 14 shown in FIG. 4, and, as in the first embodiment, the contact electrodes 23A of the semiconductor chip 23 and the contact pads 11A are aligned. The substrate film 21 and the contact sheet 22 are thereafter bonded by the adhesive etc. in reduced pressure.

After this, the test carrier is taken out from the vacuum furnace 14 into normal pressure. At this time, as shown in FIG. 14, the test carrier where the contact electrodes 23A and the contact pads 11A are contacted is completed.

Figure 14:
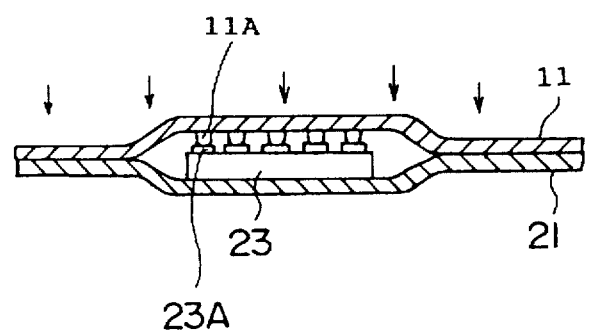
FIG. 14 is a cross-sectional view showing the test carrier for the semiconductor integrated circuit device according to the fourth embodiment of the present invention.
Figure 15:
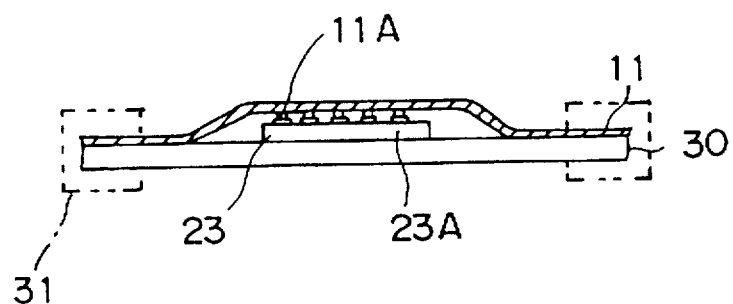
FIG. 15 is a cross-sectional view showing the test carrier for the semiconductor integrated circuit device, in which its lower sheet is formed of hard material, according to the fourth embodiment of the present invention.

Note that, instead of the flexible film substrate 11 shown in FIG. 14, a film substrate 30 made of a rigid material such as polyimide, epoxy resin etc. can be used, as shown in FIG. 15.

According to the test carrier according to the fourth embodiment shown in FIGS. 14 and 15, since it is not required to use the case having the pocket for holding the semiconductor chip, unlike the first to third embodiments, the test carrier can be readily formed and also the substrate can be easily formed. Thus the cost thereof is reduced.

In the fourth embodiment described above, it should be noted that, although the sheet is secured against the substrate by the adhesive in the above four embodiments, a frame member 31 made of a rubber etc. can be formed so as to surround and cover circumferences of the sheet 11 and the substrate 30 in reduced pressure as shown by a dashed line in FIG. 15.

What is claimed is:

1. A test carrier for a semiconductor integrated circuit device, comprising:
   a substrate for supporting thereon a semiconductor chip in which a semiconductor integrated circuit is formed, such that electrodes of said semiconductor chip are directed upwardly; and
   a sheet for covering said substrate, said sheet having contact pads to be contacted to said electrodes of said semiconductor chip when a clearance formed between said sheet and said substrate is reduced and formed on one surface thereof, and said sheet having connecting wirings to be connected to said contact pads.

2. The test carrier for the semiconductor integrated circuit device according to claim 1, wherein a body of said sheet is formed of flexible film.

3. The test carrier for the semiconductor integrated circuit device according to claim 1, wherein said substrate is formed of flexible film.

4. The test carrier for the semiconductor integrated circuit device according to claim 1, wherein said sheet and said substrate are bonded via an adhesive.

5. The test carrier for the semiconductor integrated circuit device according to claim 1, wherein a clearance formed between said sheet and said substrate is filled with an inert gas.

6. The test carrier for the semiconductor integrated circuit device according to claim 1, wherein a concave portion for holding said semiconductor chip thereon is formed on said substrate.

7. The test carrier for the semiconductor integrated circuit device according to claim 6, wherein a groove is formed around said concave portion of said substrate.

8. The test carrier for the semiconductor integrated circuit device according to claim 6, wherein a groove is formed around said concave portion of said substrate and a sealing material is fitted in said groove.

9. The test carrier for the semiconductor integrated circuit device according to claim 1, wherein a switching valve to be extended to an upper surface is provided on a rear portion of said substrate.

10. The test carrier for the semiconductor integrated circuit device according to claim 1, wherein a notched groove having a depth not to contact to said sheet is formed on part of an edge of said substrate.

11. The test carrier for the semiconductor integrated circuit device according to claim 1, wherein alignment marks are written into surfaces of said sheet and said substrate.

12. The test carrier for the semiconductor integrated circuit device according to claim 1, further comprising:
   a frame body for sealing a circumferences of said sheet and said substrate.

13. A method of testing a semiconductor integrated circuit device, comprising the steps of:
   displacing a semiconductor chip on which a semiconductor integrated circuit is formed on a substrate with electrodes of said semiconductor chip being placed upwardly;
   covering said substrate by a sheet in a pressure atmosphere lower than a atmospheric pressure with contacting contact pads formed on one surface of said sheet to said electrodes of said semiconductor chip;
   exposing said substrate covered by said sheet into the air;
   fitting said substrate covered by said sheet into a testing socket so as to contact electrodes of said testing socket to connecting electrodes formed on the other surface of said sheet; and
   examining a semiconductor integrated circuit in said semiconductor chip fitted into said socket.

14. The method of testing the semiconductor integrated circuit device according to claim 13, wherein said contact pads is contacted to said electrodes of said semiconductor chip in a gradually reduced pressure atmosphere.

15. The method of testing the semiconductor integrated circuit device according to claim 13, wherein said substrate is covered by said sheet via an adhesive.

16. The method of testing the semiconductor integrated circuit device according to claim 13, wherein said substrate is covered by said sheet in an inert gas atmosphere.

17. The method of testing the semiconductor integrated circuit device according to claim 13, wherein a testing for said semiconductor integrated circuit is conducted in a heating atmosphere.

18. A method of testing a semiconductor integrated circuit device, comprising the steps of:

displacing a semiconductor chip, on which a semiconductor integrated circuit is formed, on a substrate such that electrodes of said semiconductor chip is placed upwardly;

covering said substrate by a sheet with contacting contact pads formed on one surface of said sheet to said electrodes of said semiconductor chip;

reducing a pressure in a clearance between said sheet and said substrate via a switching valve fitted on said substrate;

fitting said substrate covered by said sheet into a testing socket in the air to contact electrodes of said socket to connecting electrodes formed on the other surface of said sheet after said switching valve is closed; and examining a semiconductor integrated circuit in said semiconductor chip fitted into said socket.

19. The method of testing the semiconductor integrated circuit device according to claim 18, wherein said substrate is covered by said sheet via an adhesive.

20. The method of testing the semiconductor integrated circuit device according to claim 18, wherein said substrate is covered by said sheet in an inert gas atmosphere.

21. The method of testing the semiconductor integrated circuit device according to claim 18, wherein a testing for said semiconductor integrated circuit is conducted in a heating atmosphere.

* * * * *